(12) United States Patent
Choi

(10) Patent No.: US 9,159,647 B2
(45) Date of Patent: Oct. 13, 2015

(54) METHOD AND APPARATUS FOR CONNECTING MEMORY DIES TO FORM A MEMORY SYSTEM

(71) Applicant: NovaChips Canada Inc., Ottawa (CA)

(72) Inventor: Byoung Jin Choi, Ottawa (CA)

(73) Assignee: NovaChips Canada Inc., Ottawa, Ontario (CA)

( * ) Notice: Subject to any disclaimer, the term of this patent is extended or adjusted under 35 U.S.C. 154(b) by 321 days.

(21) Appl. No.: 13/750,046

(22) Filed: Jan. 25, 2013

(65) Prior Publication Data
US 2013/0193582 A1  Aug. 1, 2013

Related U.S. Application Data

(60) Provisional application No. 61/591,387, filed on Jan. 27, 2012.

(51) Int. Cl.
| | | |
|---|---|---|
| *G11C 5/06* | (2006.01) |
| *H01L 23/48* | (2006.01) |
| *H01L 21/50* | (2006.01) |
| *G11C 5/04* | (2006.01) |
| *H05K 1/02* | (2006.01) |
| *H01L 25/065* | (2006.01) |
| *H05K 1/18* | (2006.01) |

(52) U.S. Cl.
CPC  *H01L 23/48* (2013.01); *G11C 5/04* (2013.01); *G11C 5/063* (2013.01); *H01L 21/50* (2013.01); *H01L 25/0652* (2013.01); *H05K 1/0243* (2013.01); *H01L 2224/16225* (2013.01); *H01L 2225/06517* (2013.01); *H01L 2225/06527* (2013.01); *H01L 2225/06548* (2013.01); *H01L 2225/06572* (2013.01); *H05K 1/181* (2013.01); *H05K 2201/10159* (2013.01); *H05K 2201/10545* (2013.01)

(58) Field of Classification Search
CPC ... H01L 23/48; H01L 21/50; H01L 23/49827; H01L 2224/97
USPC .............. 365/63; 257/698, 778, 774, 686
See application file for complete search history.

(56) References Cited

U.S. PATENT DOCUMENTS

| | | | |
|---|---|---|---|
| 6,799,235 B2 | 9/2004 | Bormann et al. | |
| 6,808,249 B1* | 10/2004 | Kneezel et al. | 347/43 |
| 6,890,061 B1* | 5/2005 | Freire et al. | 347/42 |
| 7,061,092 B2* | 6/2006 | Akram et al. | 257/690 |
| 7,254,663 B2 | 8/2007 | Bartley et al. | |
| 7,342,816 B2 | 3/2008 | Bartley et al. | |

(Continued)

FOREIGN PATENT DOCUMENTS

CA  2515714 A1  3/2006

*Primary Examiner* — Viet Q Nguyen
(74) *Attorney, Agent, or Firm* — Shin Hung; Borden Ladner Gervais LLP

(57) ABSTRACT

A method, system and apparatus for connecting multiple memory device dies 51-54 to a substrate 56 which requires no trace between dies. A first embodiment assigns the connections of a memory device die 51 to be matched with other memory device dies 52-54 when mounted in staggered formation on the both sides of a substrate. The result is a daisy chained array connecting multiple integrated circuits with reduced capacitive loading. The capacitive loadings on the buses 57,58 between memory device dies 51,52,53 are reduced. The number of vias 57,58,59 is reduced because two stubs on the both sides of the substrate share one via. Another embodiment FIG. 7 arranges the dies in a closed loop.

7 Claims, 6 Drawing Sheets

(56) References Cited

U.S. PATENT DOCUMENTS

| | | |
|---|---|---|
| 7,345,900 B2 | 3/2008 | Bartley et al. |
| 7,380,152 B2 | 5/2008 | Chung |
| 7,545,664 B2 | 6/2009 | Bartley et al. |
| 7,650,459 B2 | 1/2010 | Eilert et al. |
| 7,676,093 B2 | 3/2010 | Hayakawa |
| RE42,363 E * | 5/2011 | Ellsberry et al. .............. 257/686 |
| 8,569,880 B2 * | 10/2013 | Inagaki et al. ................ 257/700 |
| 2006/0050496 A1 * | 3/2006 | Goodwin ...................... 361/803 |
| 2008/0062734 A1 | 3/2008 | Leddige et al. |
| 2014/0240979 A1 * | 8/2014 | Chen et al. .................... 362/235 |

* cited by examiner

METHOD AND APPARATUS FOR CONNECTING MEMORY DIES TO FORM A MEMORY SYSTEM

FIELD OF THE INVENTION

This invention relates to memory devices as used in digital electronic devices, and, more particularly, to a memory system having a plurality of memory device dies connected in serial formation usable in both daisy chain and closed loop memory systems.

BACKGROUND OF THE INVENTION

Memory devices are used to store data in digital electronic devices such as computers. The demand for large memory systems with high bandwidth and low power consumption has increased during recent years. Early multi die memory devices in digital electronics included a plurality of dies connected in parallel to a common bus such a system is said to be connected by a multi-drop bus. Multi-drop connection with several memory device dies connected to a common bus in parallel is commonly used for a large memory system.

FIG. 1 shows a prior art embodiment of multi-drop connection with double sided memory device mounding. The memory device dies 1 and 2 are mounted to the first side 7 of a substrate 6. Dies 3 and 4 are mounted on the opposite side of substrate 6 directly opposed to dies 1 and 2 respectively. Substrate 6 may be a multi-layered PCB, or other similar substrate such as a ceramic wafer. Substrate 6 often includes internally routed signal traces 9 and 10 between memory device dies 1-4. Stub through vias 11-18 allow signal traces 9 and 10 to connect to the opposite surfaces 7 and 8 of substrate 6. Stub through vias 11-18 commonly terminate in pads 21-28 on surfaces 7 and 8. Pads 21-28 are configured to connect to solder balls 29 or other connections from memory device dies 1-4 to signal traces. Stub through via allows the solder ball 29 or other connection from memory device dies to the signal traces 9 and 10. Vias 11-18 are manufactured on a larger pitch than signal traces 9 and 10 to afford extra width, and the use of several such vias can limit the number of traces that can be routed through a single layer of the substrate. This may force additional layers and extra costs. The number of memory device dies connected to a bus is large. Capacitive loading of each memory device die and long trace cause large capacitive loading on the bus so that it is hard to get high bandwidth. And large capacitive loading means large power consumption.

More recent designs use interconnection of a plurality of memory device dies are connected in serial. The reason for doing so is to reduce capacitive loading on the bus by limiting the number of memory device dies. Such an array of memory dies is commonly referred to as a Daisy Chain. A variation connects the last die in the Daisy Chain to the first die to form a loop, such a device is referred to as being loop chained. FIG. 2 shows a prior art embodiment of a daisy chained interconnection or a loop chained interconnection with double sided memory device mounting. The memory device dies 31 and 32 are mounted to the first side 37 of a substrate 36. Dies 33 and 34 are mounted on the opposite side 38 of substrate 36 substantially opposite dies 31 and 32. Substrate 36 may be a multi-layered PCB, or other similar substrate such as a ceramic wafer. Substrate 36 includes internally routed signal traces 39 between die 31 and the outside and 40 between memory device dies 31 and 32, 41 between 32 and 34, 42 between 34 and 33 and 43 between 33 and the outside. Stub through vias 46-54 allow connections to the solder balls 56 or other connection from memory device dies 31-34 to signal traces 39-43. Because memory device dies 31-34 are connected each other point to point, capacitive loading of memory device dies 31-34 on the bus are smaller and the lengths of traces 36-43 are shorter than that of multi-drop connection of FIG. 1 so that the total capacitive loading on the bus are reduced. However there are still traces 36-54 between memory device dies and so that it is hard to get high bandwidth and low power consumption.

SUMMARY OF THE INVENTION

The invention provides a method and apparatus for connecting multiple memory device dies which requires no trace between dies. This is accomplished in a first embodiment by assigning the connections of a memory device die to be matched with other memory device dies when mounted in staggered formation on the both sides of a substrate. The result is a daisy chained array connecting multiple integrated circuits internal voltages and control with reduced capacitive loading. The capacitive loadings on the buses between memory device dies are reduced. The number of vias is reduced because two stubs on the both sides of the substrate share one via.

An additional embodiment provides a method and apparatus for connecting multiple memory device dies which also requires no trace between dies. This is accomplished by assigning the connections of a memory device die to be matched with other memory device dies when mounted in staggered formation on the both sides of a substrate. The result is a loop chained array connecting multiple integrated circuits internal voltages and control with reduced capacitive loading as compared to conventional routing. The capacitive loadings on the buses between memory device dies are reduced. The number of vias is reduced because two stubs on the both sides of the substrate share one via.

The invention improves performance by eliminating length difference among buses and reducing capacitive loading on buses between memory device dies. It further reduces power consumption by reducing capacitive loading on buses between memory device dies. The result is reduced cost for substrate manufacturing by removing the traces and reducing the number of vias in substrate.

BRIEF DESCRIPTION OF DRAWINGS

Further features and advantages of the present invention will become apparent from the following detailed description, taken in combination with the appended drawings, in which.

It will be noted that throughout the appended drawings, like features are identified by like reference numerals.

DESCRIPTION OF EMBODIMENTS

Figure 1:
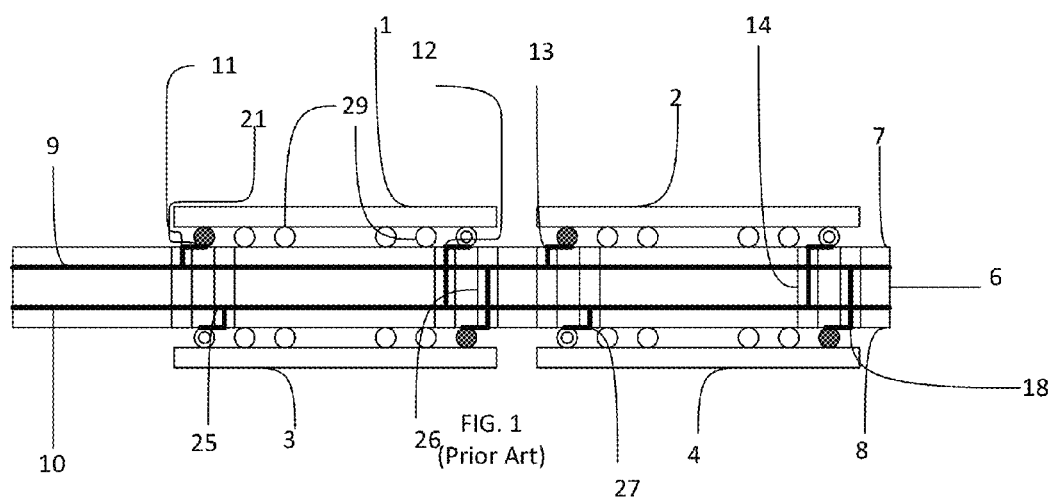
FIG. 1 shows a prior art embodiment of multi-drop connection with double sided memory device mounting.
Figure 2:
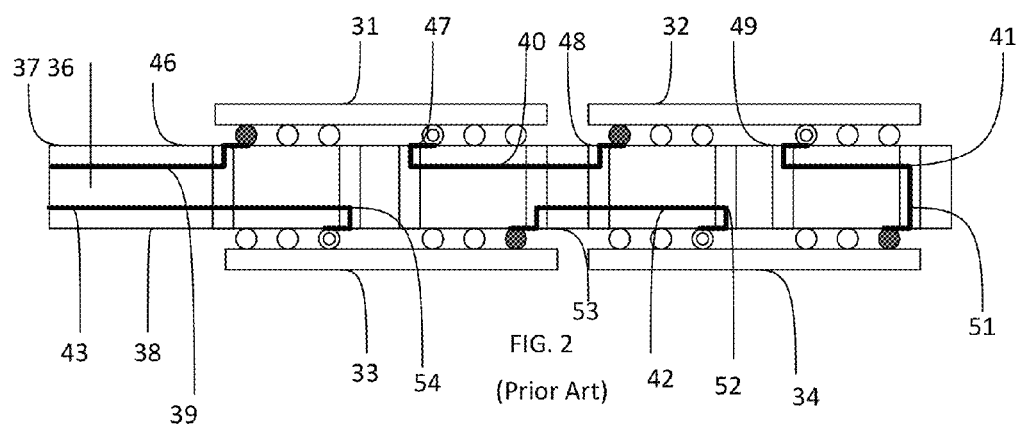
FIG. 2 shows a prior art embodiment of daisy chained or loop chained interconnection with double sided memory device mounting.
Figure 3:
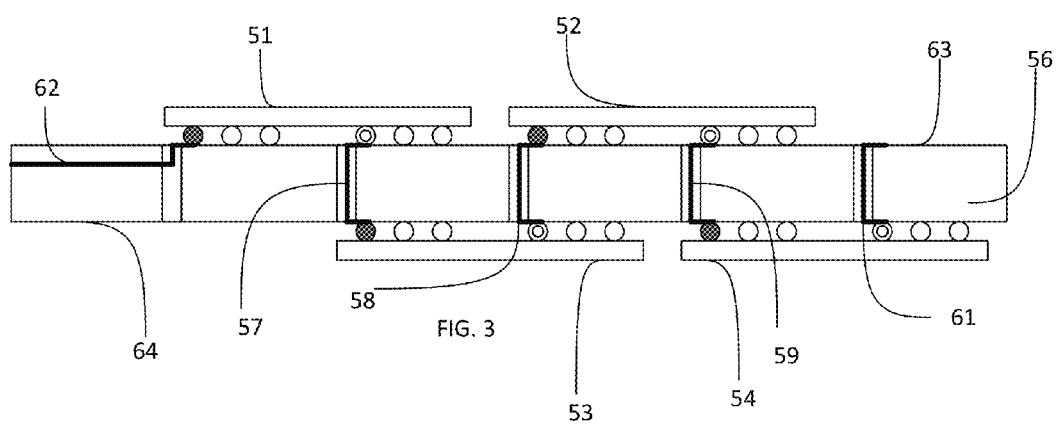
FIG. 3 shows daisy chained or loop chained interconnection with double sided memory device mounting according to an embodiment of this invention.

FIG. 3 shows an embodiment of a daisy chained interconnection with double sided memory device mounting. The memory device dies 51, 52, 53 and 54 are mounted to either side of the substrate 56 in a staggered formation. Substrate 56 may be a multi-layered PCB, ceramic wafer or any other substrate. Stub through via 57 connects die 51 to die 53. Stub through via 58 connects die 52 to die 53. Stub through via 59 connects die 52 to die 54. Vias 61 and 62 connect dies 54 and 51 to the outside respectively. Connections to vias 57-62 may be by solder balls and pads, pins, sockets or other connection from memory device dies 51, 52, 53 and 54. Dies 51 and 52 mounted on one side 63 of substrate 56 are connected to memory device dies 53 and 54 mounted on the other side 64 of the substrate. Because stubs of both sides of substrate share one via, the number of vias are reduced by 50% and each via can have larger pitch. Substrate 56 does not have an internally routed signal trace between two memory device dies. Layers in substrate 56 can be reduced due to the larger via pitch and the lack of a trace between memory device dies. Because memory device dies 51-54 are connected each other point to point and there is no trace between memory device dies, capacitive loading on a bus are smaller than that of any of prior art.

Figure 4:
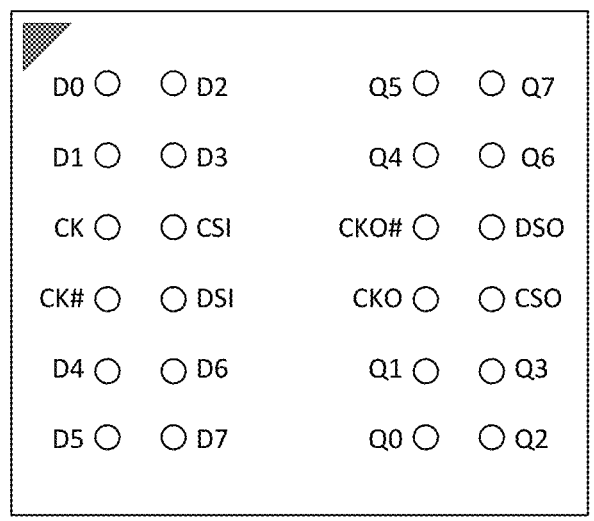
FIG. 4 shows a ball array of memory device die according to an embodiment of this invention.

FIG. 4 shows a typical ball array of a memory device die as used in the current invention. The names of the balls are one of examples and may be different from device to device.

Figure 5:
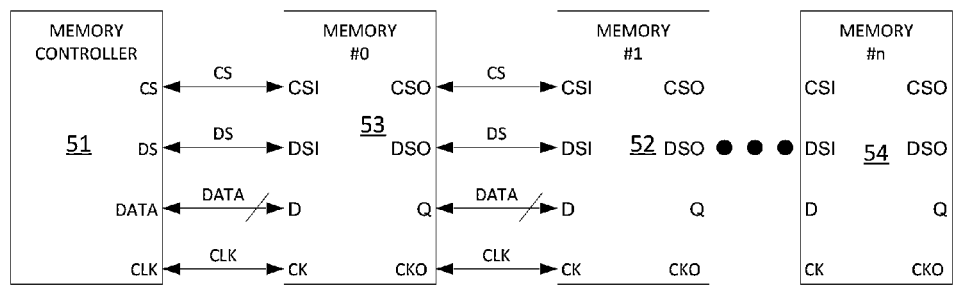
FIG. 5 is a block diagram showing connections for a daisy chained interconnection.

FIG. 5 is a block diagram of an arrangement of memory device dies as shown in FIG. 4 in daisy chained interconnection.

Figure 6:
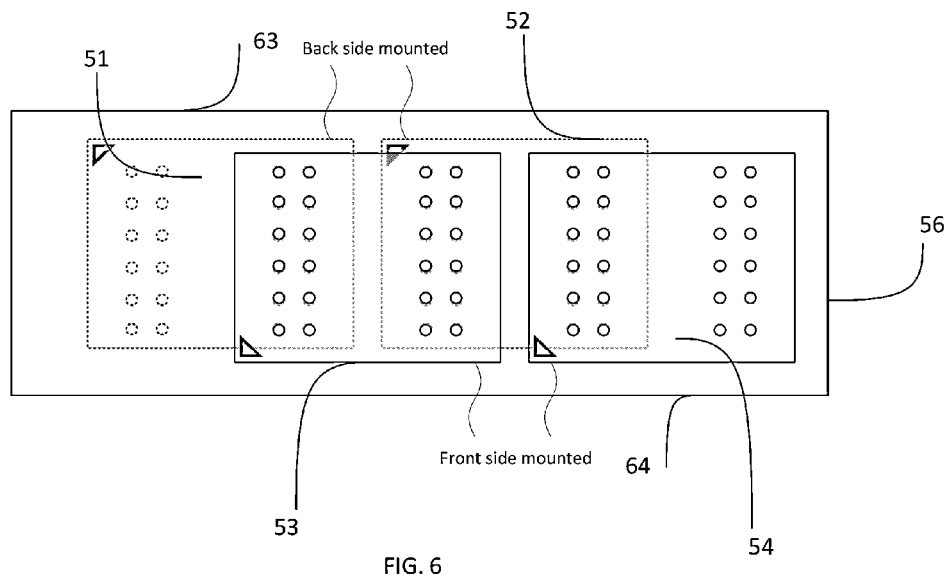
FIG. 6 is a perspective view of the FIG. 3 embodiment.

FIG. 6 is a perspective view of the FIG. 3 embodiment using FIG. 4 dies. It is noted that dies 51 and 52 are mounted on side 63 of substrate 56 with notches pointing up and dies 53 and 54 are mounted to opposite side 64 of substrate 56 with notches pointing down. This configuration ensures minimal via length.

Figures 7, 8:
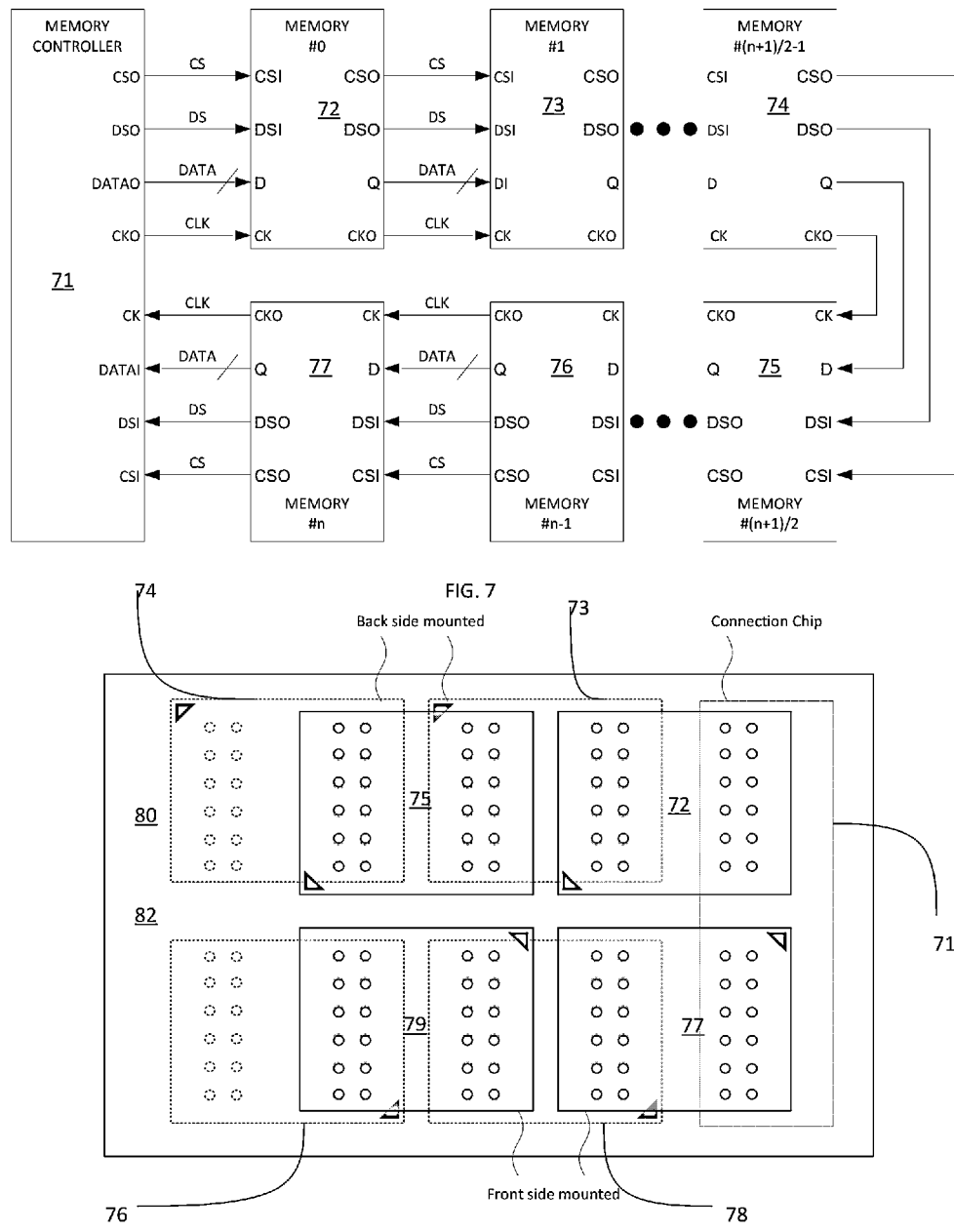
FIG. 7 is a block diagram showing connections for loop chained interconnection.
FIG. 8 is a perspective view of an alternative embodiment.

FIG. 7 is a block diagram of an arrangement of memory dies as shown in FIG. 4 in a loop chained interconnection. Connection chip 71 can be another memory device die or an interface chip. Connection chip 71 can also be removed and connection done by substrate traces. As shown by the dots ( . . . ) there may be any number of dies.

FIG. 8 is a perspective view of the FIG. 7 configuration with eight dies 72-79 incorporating a second embodiment. Connection chip 71 can be another memory device die or an interface chip. Connection chip 71 can also be removed and connection done by substrate traces. It is noted that connection chip 71 is mounted on side 81 of substrate 80 along with dies 73, and 74 with notches pointing up and dies 76 and 78 mounted with notches pointing down. On opposite side 82 of substrate 80 with notches pointing up are dies 77 and 79 and dies 72 and 75 with notches pointed down. This configuration ensures minimal via length.

The invention claimed is:

1. A memory system comprising:
a substrate having a first side and a second side;
first memory devices mounted to the first side of said substrate, and;
second memory devices mounted to the second side of said substrate in staggered formation relative to said first memory devices; and,
vias extending from the first side to the second side of the substrate and connected to connections of the first memory devices and the second memory devices.

2. The memory system as in claim 1, wherein there are four memory devices connected in series.

3. The memory system as in claim 1, further comprising a controller mounted to one side of said substrate configured to control operation of the first memory devices and the second memory devices.

4. A method for constructing a memory system comprising:
mounting first memory devices to a first side of a substrate to connect connections of the first memory devices to vias extending from the first side to a second side of the substrate; and,
mounting second memory devices on the second side of the substrate staggered and in opposite orientation to the first memory devices on the first side of the substrate, to connect connections of the second devices to the vias.

5. A memory system comprising:
a substrate;
first memory devices mounted to a first side of said substrate;
second memory devices mounted to a second side of said substrate and staggered from said first memory devices;
vias extending from the first side to the second side of the substrate and connected to connections of the first memory devices and the second memory devices; and
a controller connected to said substrate for controlling operation of the first memory devices and the second memory devices.

6. The memory system as in claim 5, wherein the first memory devices and the second memory devices are serially connected to each other.

7. The memory system as in claim 6, wherein said controller is connected to a first memory device and a last memory device of the serially connected first memory devices and second memory devices.

* * * * *